United States Patent
Chen et al.

(10) Patent No.: US 10,629,555 B2
(45) Date of Patent: Apr. 21, 2020

(54) PACKAGING DEVICES AND METHODS OF MANUFACTURE THEREOF

(71) Applicant: Taiwan Semiconductor Manufacturing Company, Ltd., Hsin-Chu (TW)

(72) Inventors: Hsien-Wei Chen, Hsin-Chu (TW); Jie Chen, New Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 51 days.

(21) Appl. No.: 15/295,542

(22) Filed: Oct. 17, 2016

(65) Prior Publication Data

US 2017/0033064 A1    Feb. 2, 2017

Related U.S. Application Data

(62) Division of application No. 14/074,333, filed on Nov. 7, 2013, now Pat. No. 9,472,522.

(51) Int. Cl.
*H04L 23/00* (2006.01)
*H01L 23/00* (2006.01)
(Continued)

(52) U.S. Cl.
CPC ............ *H01L 24/09* (2013.01); *H01L 21/56* (2013.01); *H01L 23/3171* (2013.01); *H01L 23/49838* (2013.01); *H01L 23/5389* (2013.01); *H01L 23/562* (2013.01); *H01L 24/02* (2013.01); *H01L 24/03* (2013.01); *H01L 24/05* (2013.01); *H01L 24/06* (2013.01); *H01L 24/11* (2013.01);
(Continued)

(58) Field of Classification Search
CPC .......... H01L 24/11; H01L 2224/11334; H01L 2224/05572; H01L 2224/0401; H01L 2924/0001; H01L 2224/13111; H01L 2224/0231; H01L 2224/13021
See application file for complete search history.

(56) References Cited

U.S. PATENT DOCUMENTS 6,392,163 B1    5/2002    Rinne et al.
6,777,815 B2    8/2004    Huang
(Continued)

FOREIGN PATENT DOCUMENTS

GB    2464549 A    4/2010
JP    2012023065    2/2012
(Continued)

*Primary Examiner* — Mohammed R Alam
(74) *Attorney, Agent, or Firm* — Slater Matsil, LLP

(57) ABSTRACT

Packaging devices and methods of manufacture thereof for semiconductor devices are disclosed. In some embodiments, a packaging device includes a contact pad disposed over a substrate, and a passivation layer disposed over the substrate and a first portion of the contact pad, a second portion of the contact pad being exposed. A post passivation interconnect (PPI) line is disposed over the passivation layer and is coupled to the second portion of the contact pad. A PPI pad is disposed over the passivation layer and is coupled to the PPI line. An insulating material is disposed over the PPI line, the PPI pad being exposed. The insulating material is spaced apart from an edge portion of the PPI pad by a predetermined distance.

19 Claims, 6 Drawing Sheets

(51) Int. Cl.
  *H01L 23/538* (2006.01)
  *H01L 23/498* (2006.01)
  *H01L 21/56* (2006.01)
  *H01L 23/31* (2006.01)

(52) U.S. Cl.
  CPC .............. *H01L 24/13* (2013.01); *H01L 24/19* (2013.01); *H01L 24/20* (2013.01); *H01L 23/3192* (2013.01); *H01L 24/10* (2013.01); *H01L 2224/0214* (2013.01); *H01L 2224/0231* (2013.01); *H01L 2224/0235* (2013.01); *H01L 2224/0239* (2013.01); *H01L 2224/02175* (2013.01); *H01L 2224/02311* (2013.01); *H01L 2224/02313* (2013.01); *H01L 2224/02315* (2013.01); *H01L 2224/02331* (2013.01); *H01L 2224/02335* (2013.01); *H01L 2224/02351* (2013.01); *H01L 2224/02373* (2013.01); *H01L 2224/0381* (2013.01); *H01L 2224/0382* (2013.01); *H01L 2224/03462* (2013.01); *H01L 2224/03464* (2013.01); *H01L 2224/03828* (2013.01); *H01L 2224/0401* (2013.01); *H01L 2224/04105* (2013.01); *H01L 2224/05008* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05548* (2013.01); *H01L 2224/05551* (2013.01); *H01L 2224/05552* (2013.01); *H01L 2224/05567* (2013.01); *H01L 2224/05624* (2013.01); *H01L 2224/05647* (2013.01); *H01L 2224/05655* (2013.01); *H01L 2224/05666* (2013.01); *H01L 2224/05671* (2013.01); *H01L 2224/06131* (2013.01); *H01L 2224/06136* (2013.01); *H01L 2224/06179* (2013.01); *H01L 2224/0912* (2013.01); *H01L 2224/11013* (2013.01); *H01L 2224/11334* (2013.01); *H01L 2224/11849* (2013.01); *H01L 2224/12105* (2013.01); *H01L 2224/13* (2013.01); *H01L 2224/131* (2013.01); *H01L 2224/13014* (2013.01); *H01L 2224/13016* (2013.01); *H01L 2224/13022* (2013.01); *H01L 2224/13024* (2013.01); *H01L 2224/13109* (2013.01); *H01L 2224/13111* (2013.01); *H01L 2224/13116* (2013.01); *H01L 2224/13139* (2013.01); *H01L 2224/13147* (2013.01); *H01L 2224/211* (2013.01); *H01L 2224/215* (2013.01); *H01L 2224/221* (2013.01); *H01L 2924/014* (2013.01); *H01L 2924/01013* (2013.01); *H01L 2924/01022* (2013.01); *H01L 2924/01023* (2013.01); *H01L 2924/01024* (2013.01); *H01L 2924/01028* (2013.01); *H01L 2924/01029* (2013.01); *H01L 2924/0132* (2013.01); *H01L 2924/01074* (2013.01); *H01L 2924/01322* (2013.01); *H01L 2924/059* (2013.01); *H01L 2924/05042* (2013.01); *H01L 2924/05442* (2013.01); *H01L 2924/06* (2013.01); *H01L 2924/07025* (2013.01); *H01L 2924/10253* (2013.01); *H01L 2924/14* (2013.01); *H01L 2924/181* (2013.01); *H01L 2924/2064* (2013.01); *H01L 2924/20641* (2013.01); *H01L 2924/3512* (2013.01)

(56) References Cited

U.S. PATENT DOCUMENTS

| | | | |
|---|---|---|---|
| 7,977,783 B1* | 7/2011 | Park | H01L 24/11 257/692 |
| 2002/0185721 A1 | 12/2002 | Hwang et al. | |
| 2004/0053483 A1 | 3/2004 | Nair et al. | |
| 2004/0171193 A1 | 9/2004 | Hayashida | |
| 2006/0138671 A1* | 6/2006 | Watanabe | H01L 23/3114 257/773 |
| 2006/0138675 A1 | 6/2006 | Rinne | |
| 2006/0214293 A1 | 9/2006 | Park et al. | |
| 2006/0226542 A1* | 10/2006 | Chien | H01L 23/3114 257/737 |
| 2007/0007664 A1 | 1/2007 | Lee et al. | |
| 2008/0128905 A1 | 6/2008 | Lee et al. | |
| 2008/0308934 A1 | 12/2008 | Alvarado et al. | |
| 2009/0079094 A1 | 3/2009 | Lin | |
| 2009/0302468 A1 | 12/2009 | Baek et al. | |
| 2009/0309216 A1* | 12/2009 | Jeon | H01L 24/11 257/737 |
| 2010/0244239 A1 | 9/2010 | Bao et al. | |
| 2011/0186987 A1* | 8/2011 | Wang | H01L 23/3171 257/737 |
| 2011/0260317 A1* | 10/2011 | Lu | H01L 24/11 257/737 |
| 2011/0272819 A1 | 11/2011 | Park et al. | |
| 2012/0248599 A1* | 10/2012 | Ring | H01L 24/05 257/737 |
| 2013/0043583 A1 | 2/2013 | Wu et al. | |
| 2014/0252601 A1 | 9/2014 | Lu et al. | |
| 2014/0264846 A1 | 9/2014 | Chen et al. | |

FOREIGN PATENT DOCUMENTS

| | | |
|---|---|---|
| KR | 20090031293 A | 3/2009 |
| KR | 20110123526 A | 11/2011 |
| KR | 20130020512 A | 2/2013 |
| TW | 479344 B | 3/2002 |
| TW | 498530 B | 8/2002 |
| TW | 200527625 A | 8/2005 |
| TW | I249822 B | 2/2006 |

* cited by examiner

PACKAGING DEVICES AND METHODS OF MANUFACTURE THEREOF

PRIORITY CLAIM AND CROSS-REFERENCE

This application is a divisional of U.S. patent application Ser. No. 14/074,333, entitled "Packaging Devices and Methods of Manufacture Thereof," filed on Nov. 7, 2013, which application is hereby incorporated herein by reference.

This application relates to the following co-pending and commonly assigned patent application Ser. No. 13/894,107, filed on May 14, 2013, entitled, "Packaging Devices and Methods of Manufacture Thereof," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts can be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices and methods of manufacture thereof for semiconductor devices. Novel cost-effective wafer level chip scale package (WLCSP) schemes will be described herein that include an insulating material that is spaced apart from a post passivation interconnect (PPI) pad by a predetermined distance so that flux can more easily be removed from proximate a conductive material soldered to the PPI pad. The enlarged opening proximate the conductive material in the uppermost insulating material layer increases the distance between the insulating material and the conductive material, facilitating in the removal of flux from a gap and an enclosure disposed adjacent the conductive material, and preventing flux-induced solder ball dissolution and leakage.

Figure 1:
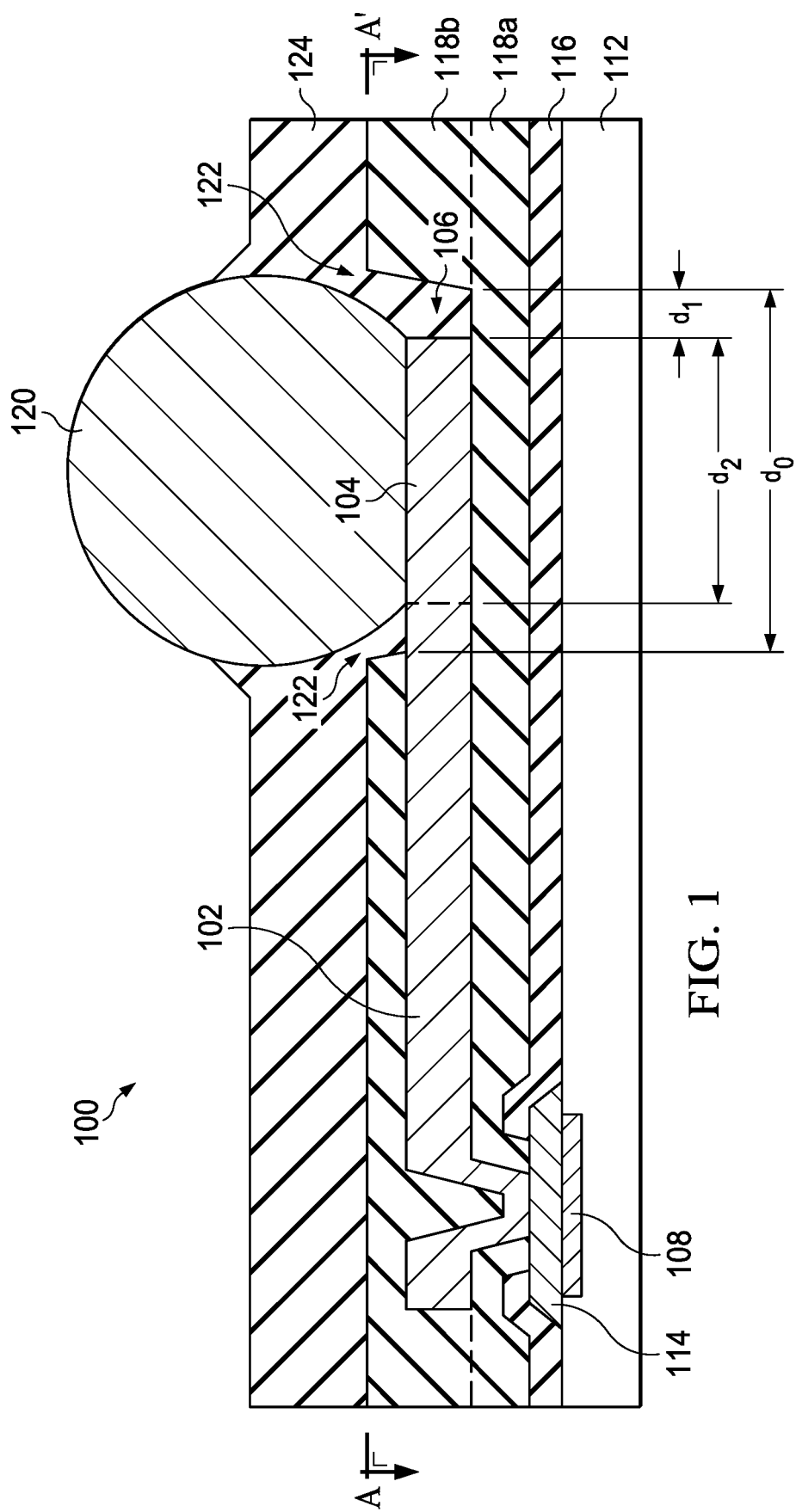
FIG. 1 illustrates a cross-sectional view of a packaging device in accordance with some embodiments of the present disclosure.
Figure 2:
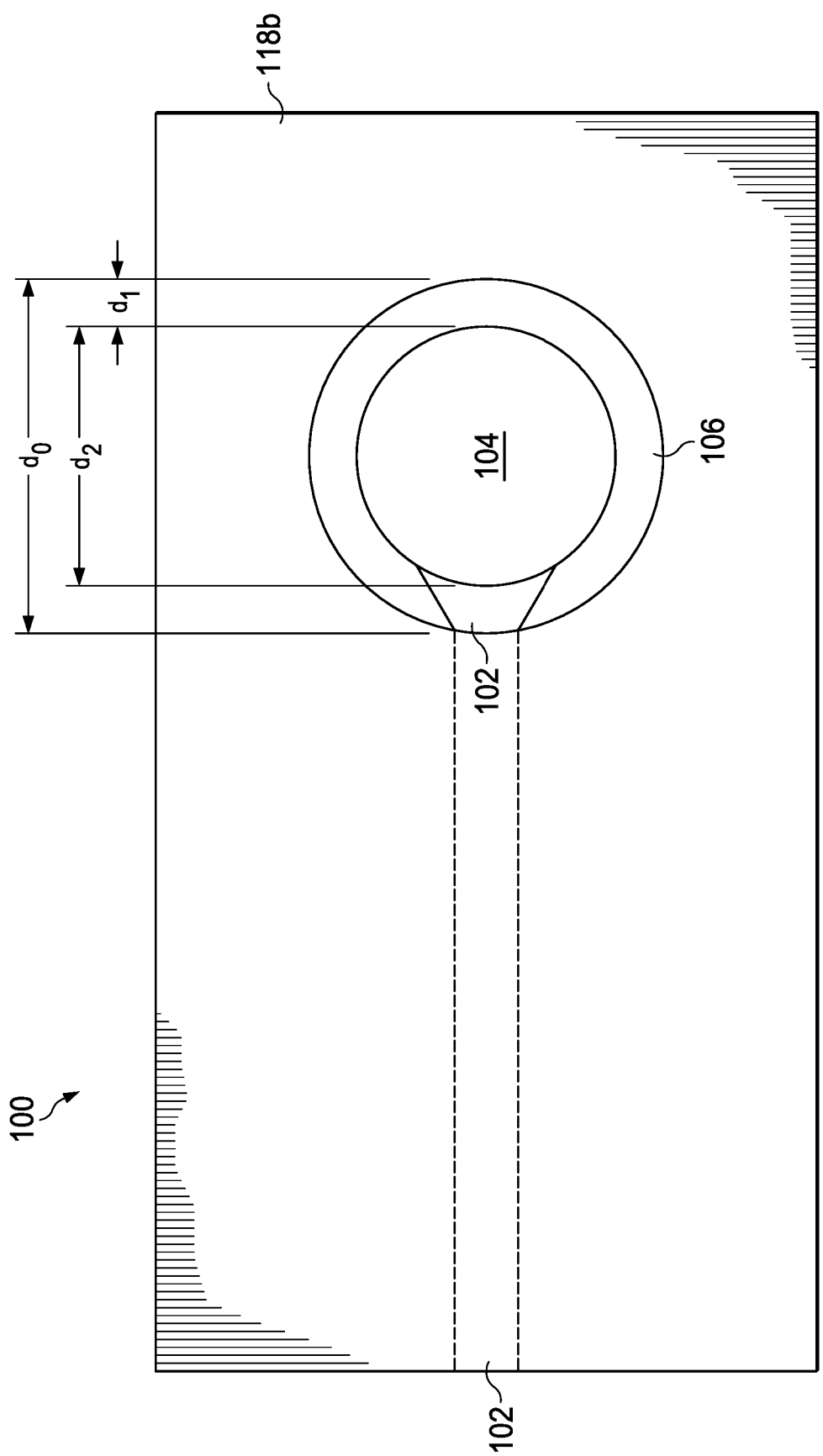
FIG. 2 is a top view of a portion of the packaging device shown in FIG. 1 at view A-A' of FIG. 1.

Referring first to FIG. 1, a cross-sectional view of a packaging device 100 in accordance with some embodiments of the present disclosure is illustrated. A top view of the packaging device 100 at view A-A' of FIG. 1 is shown in FIG. 2. The packaging device 100 includes a PPI line 102 and a PPI pad 104 disposed over a substrate 112. The PPI line 102 and PPI pad 104 comprise a conductive material and are integral to one another in some embodiments. Only one PPI line 102 and PPI pad 104 are shown in the drawings; however, a plurality of PPI lines 102 and PPI pads 104 are formed across a surface of the packaging device 100 and are used for making electrical connections to a plurality of contact pads 114 disposed over a substrate 112. PPI line 102 and PPI pad 104 comprise a redistribution layer (RDL) or other interconnect routing structures of the packaging device 100 in some embodiments, for example.

The PPI line 102 is a conductive line that extends over an underlying contact pad 114. The PPI line 102 fills an opening in an insulating material 118a and a passivation layer 116 and forms an electrical connection with the contact pad 114. The PPI line 102 contacts the PPI pad 104. The PPI line 102 may have a narrow, wide, or tapered shape in a top view. The PPI line 102 may comprise a substantially constant thickness and width. The PPI line 102 terminates at the PPI pad 104; therefore, the bodies of the PPI line 102 and the PPI pad 104 may be formed as one piece. The PPI pad 104 comprises a shape of a circle in a top view in some embodiments, as shown in FIG. 2. In other embodiments, the PPI pad 104 may comprise the shape of an oval, square, rectangle, or other shapes in a top view.

An insulating material 118b is disposed over the PPI line 102 and portions of insulating material 118a. The insulating material 118b has an opening over the PPI pad 104 and proximate edge portions of the PPI pad 104. The PPI pad 104 is exposed through the opening in the insulating material 118b. The opening in the insulating material 118b comprises a width in a cross-sectional or top view of dimension $d_0$. Dimension $d_0$ comprises about 210 μm to about 220 μm or greater in some embodiments. In the embodiment shown in FIG. 1, dimension $d_0$ may comprise about 250 or 260 μm, for example. Alternatively, dimension $d_0$ may comprise other values.

The opening in the insulating material 118b includes an enclosure 106 disposed around edge regions of the PPI pad 104. The enclosure 106 has a width comprising dimension $d_1$. The insulating material 118b is spaced apart from an edge portion of the PPI pad 104 by a predetermined distance, wherein the predetermined distance comprises the width of the enclosure 106 comprising dimension $d_1$. In some embodiments, the insulating material 118b is spaced apart from some, but not all, edge portions of the PPI pad 104 comprising dimension $d_1$ (not shown in FIG. 1; see FIG. 6). In other embodiments, the insulating material 118b is spaced apart from all edge portions of the PPI pad 104 by the predetermined distance comprising dimension $d_1$, as shown in FIGS. 1 and 2.

A conductive material 120 is coupled to the PPI pad 104. The conductive material 120 comprises a eutectic material such as solder and comprises a substantially spherical shape with one flat side proximate the PPI pad 104, in some embodiments. The conductive material 120 is attached to the PPI pad 104 using a 'solder ball drop' process or other method. The conductive material 120 comprises a wetting area proximate a bottom surface thereof that is substantially a same width or diameter as the PPI pad 104. Dimension $d_0$ is greater than a width or diameter of the PPI pad 104 by the width of the enclosure 106 comprising dimension $d_1$ along a perimeter of the PPI 104 in some embodiments. Dimension $d_1$ comprises about 5 to 10 μm or greater in some embodiments. Alternatively, dimension $d_1$ may comprise other values.

The PPI pad 104 comprises a width (which width comprises a diameter in embodiments wherein the PPI pad 104 comprises a circular shape, for example) comprising dimension $d_2$. Dimension $d_2$ comprises about 200 μm in some embodiments, for example. In the embodiment shown in FIG. 1, dimension $d_2$ comprises about 240 μm, as an example. Alternatively, dimension $d_2$ may be greater or less than 200 μm depending on the design rule for packaging device 100, for example. Dimension $d_2$ comprises about 180 μm to about 260 μm in other embodiments, as another example. Alternatively, dimension $d_2$ may comprise other values.

Dimension $d_0$ is greater than dimension $d_2$ in accordance with some embodiments of the present disclosure, as another example. Dimension $d_0$ comprises about (dimension $d_2+2*d_1$) in accordance with some embodiments.

In the top view of the packaging device 100 shown in FIG. 2, the enclosure 106 having the width comprising dimension $d_1$ is disposed around edge portions of the PPI pad 104. The enclosure 106 is disposed between edge portions of the PPI pad 104 and edges of the opening in the insulating material 118b. The enclosure 106 comprises a ring shape in some embodiments, for example. Alternatively, the enclosure 106 may comprise a crescent shape or other shapes. The enclosure 106 is not disposed between edge portions of the PPI pad 104 and edges of the opening in the insulating material 118b in some embodiments, e.g., in a region where the PPI line 102 extends to connect to the PPI pad 104. The enclosure 106 is discontinuous in the region where the PPI line 102 extends to couple to the PPI pad 104, for example.

Referring again to FIG. 1, the opening in the insulating material 118b that comprises a greater width or diameter than the width or diameter of the PPI pad 104 advantageously results in a gap 122 between the insulating material 118b and the conductive material 120. The conductive material 120 is spaced apart from the insulating material 118b in some embodiments of the present disclosure, as illustrated in FIG. 1. The enlarged opening in the insulating material 118b results in providing the gap 122 wherein flux or other materials can be cleaned away from the sides of the conductive material 120.

In some embodiments, after the attachment of the conductive material 120 to the PPI pad 104, a cleaning process is performed to remove flux and/or other debris. A molding material 124 is then applied in some embodiments, as shown in FIG. 1. Alternatively, the molding material 124 may be applied before the conductive material 120 is attached to the PPI pad 104, in other embodiments, and an opening is formed in the molding material 124 so that the conductive material 120 can be attached or soldered to the PPI pad 104. In some embodiments, a molding material 124 is not applied.

A manufacturing process for the packaging device 100 will next be described. First, the substrate 112 is provided. The substrate 112 may comprise a workpiece comprising silicon, other types of bulk semiconductor material, or other materials, as examples. The substrate 112 may include one or more ICs formed thereon, not shown. The IC(s) may contain active and passive devices, conductive layers, and dielectric layers according to the electrical design of the IC(s), as examples. The substrate 112 includes a conductive pad or line 108 formed proximate a top surface thereof in an uppermost metallization or semiconductive layer in some embodiments.

A conductive layer is formed as a contact pad 114 using a patterning and deposition process over the substrate 112. The contact pad 114 is coupled to the conductive pad or line 108 in some embodiments. The contact pad 114 may comprise aluminum (Al), copper (Cu), tin (Sn), nickel (Ni), gold (Au), silver (Ag), other electrically conductive materials, or multiple layers or combinations thereof, as examples. The contact pad 114 may be formed using an electrolytic plating or electro-less plating process, for example. The size, shape, and location of the contact pad 114 are only for illustration purposes. A plurality of the contact pads 114 (not shown) are formed over the surface of the substrate 112, and the contact pads 114 may be of the same size or of different sizes.

A passivation layer 116 is formed over the surface of the substrate 112 and over the top surface of the contact pad 114 for structural support and physical isolation. The passivation layer 116 comprises silicon nitride (SiN), silicon dioxide ($SiO_2$), silicon oxynitride (SiON), polyimide (PI), benzocyclobutene (BCB), polybenzoxazole (PBO), other insulating materials, or combinations or multiple layers thereof, as examples. An opening in the passivation layer 116 may be made by removing a portion of passivation layer 116 using a mask-defined photoresist etching process to expose a portion of the contact pad 114, while leaving another portion of the contact pad 114 covered.

An insulating material 118a is formed on the passivation layer 116, following the contour of the passivation layer 116 and filling a portion of the opening of the passivation layer 116 over the contact pad 114. The insulating material 118a comprises a polymer in some embodiments, for example. The insulating material 118a may not completely fill the opening of the passivation layer 116 over the contact pad 114; rather, it may be patterned to form an opening to expose a portion of the contact pad 114, while covering other portions of the contact pad 114. The patterning of the insulating material 118a may include photolithography techniques. The insulating material 118a may be formed of a polymer, such as an epoxy, polyimide, BCB, PBO, and the like, although other relatively soft, often organic, dielectric materials may also be used. Spin coating or other commonly used formation methods may be used to apply the insulating material 118a. In some embodiments, insulating material 118a comprises a "PBO1" layer, for example. The thickness of the insulating material 118a may be between about 5 µm and about 30 µm, for example. Alternatively, the insulating material 118a may comprise other dimensions.

A conductive material such as a metal is used to form the PPI line 102 and PPI pad 104 over the insulating material 118a, following the contour of the insulating material 118a. The PPI line 102 and PPI pad 104 may have a thickness of less than about 30 µm, and may comprise a thickness of about 2 µm to about 10 µm in some embodiments, as examples. The PPI line 102 and PPI pad 104 may comprise a metal such as Ti, Al, Ni, nickel vanadium (NiV), Cu, or combinations or multiple layers thereof, as examples. The PPI line 102 and PPI pad 104 may be formed using electrolytic plating, electro-less plating, sputtering, chemical vapor deposition methods, and/or photolithography processes, for example. The PPI line 102 and PPI pad 104 may comprise a single layer or multiple layers using an adhesion layer of Ti, TiW, Cr, or other materials, for example. Alternatively, the PPI line 102 and PPI pad 104 may comprise other materials and dimensions, and may be formed using other methods. The substrate 112 is connected to a number of PPI lines 102 and PPI pads 104 which may electrically connect to the contact pads 114 of the substrate 112, for example.

In some embodiments, a blanket coating of conductive material may be formed over the insulating material 118a and the exposed portion of the contact pad 114, and the conductive material is patterned using lithography, e.g., by forming a layer of photoresist (not shown) over the conductive material, patterning the photoresist, and using the photoresist as an etch mask during an etch process for the conductive material, forming the conductive material into the desired patterns and shapes of the PPI lines 102 and PPI pads 104. The layer of photoresist is then removed. In other embodiments, a seed layer (also not shown) is formed over the insulating material 118a and exposed portion of the contact pad 114, and a layer of photoresist is formed over the seed layer. The photoresist is patterned with the desired patterns and shapes of the PPI lines 102 and PPI pads 104. The conductive material is then plated onto the seed layer through the patterns in the photoresist. The photoresist is removed, and the seed layer is removed from over the insulating material 118a. Alternatively, other methods may be used to form the PPI lines 102 and PPI pads 104. In some embodiments, the PPI lines 102 and PPI pads 104 are simultaneously formed in a single step. A portion of the PPI line 102 extends through an opening in the insulating material 118a and an opening in the passivation layer 116 and is coupled to the contact pad 114.

An insulating material 118b is formed over the PPI line 102, PPI pad 104, and exposed portions of insulating material 118a. Insulating material 118b may comprise similar materials and dimensions as described for insulating material 118a, for example. Alternatively, insulating material 118b may comprise other materials and dimensions. Insulating material 118b and insulating material 118a may comprise the same or different materials. In some embodiments, insulating material 118b comprises a "PBO2" layer, for example. Insulating material 118b is patterned to expose the PPI pad 104 and some or all edge portions of the PPI pad 104 except in regions where the PPI line 102 connects to the PPI pad 104 in some embodiments, using a lithography process or direct patterning methods, as examples. Alternatively, other methods may be used to pattern the insulating material 118b.

Insulating material 118a and insulating material 118b are also referred to herein, e.g., in some of the claims, as a first insulating material and/or a second insulating material, depending on the order of introduction.

A solder flux (not shown) may be applied to the PPI line 102 and PPI pad 104 in some embodiments to assist in the flow of the solder, such that the subsequently formed conductive material 120 makes good physical and electrical contact with the PPI pad 104. The flux may be applied by brushing, spraying, a stencil, or other methods, as examples. The flux generally has an acidic component that removes oxide barriers from the solder surfaces, and an adhesive quality.

The conductive material 120 is then formed over the PPI pad 104 within the opening in the insulating material 118b. The PPI pad 104 is used to connect to the conductive material 120, forming a connection between the contact pad 114 to the conductive material 120 by way of the PPI line 102 and the PPI pad 104. The conductive material 120 may have a larger width or diameter (see dimension $d_5$ shown in FIG. 4) than the diameter or width comprising dimension $d_2$ of the PPI pad 104 in some embodiments.

The conductive material 120 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials 120 such as solder balls may be formed from SnCu compounds as well, without the use of silver (Ag). Alternatively, lead-free solder connectors may include tin and silver, Sn—Ag, without the use of copper. The conductive material 120 may be one among an array of the conductive materials 120 formed as a grid, referred to as a "ball grid array" or "BGA". The conductive materials 120 may alternatively be arranged in other shapes. The conductive material 120 comprises a conductive ball having a shape of a partial sphere in some embodiments. Alternatively, the conductive material 120 may comprise other shapes. The conductive material 120 may also comprise non-spherical conductive connectors, for example.

The conductive material 120 is attached in some embodiments using a solder ball drop process. During the conductive material 120 mounting process, or after the conductive material mounting process, the eutectic material of the conductive material 120 may be re-flowed, forming a wetting region over the PPI pad 104. In some embodiments, the wetting region is formed over a portion of the PPI line 102, not shown. In some embodiments, a wetting region is not formed on the PPI line 102.

A molding material 124 comprising a molding compound is then formed over the PPI line 102, PPI pad 104, and exposed portions of the insulating material 118a in some embodiments, also shown in FIG. 1. A top portion of the molding material 124 may be recessed so that a top portion of the conductive material 120 is exposed. Alternatively, an amount of the molding material 124 can be controlled so that the top portion of the conductive material 120 is exposed. A molding compound clamp may be applied during a curing process and a plasma treatment process of the molding material 124 in some embodiments, for example.

FIG. 2 is a top view of a portion of the packaging device 100 shown in FIG. 1 at view A-A' of FIG. 1. A PPI pad 104 having a substantially circular shape is shown. The opening in the insulating material 118b comprises a width or diameter comprising dimension d0 that is greater than a width or diameter comprising dimension d2 of the PPI pad 104 along a perimeter of the PPI pad 104 by a dimension of about (2*d1) in some embodiments. A portion of the PPI line 102 is visible in the top view proximate the PPI pad 104, creating a discontinuity in the enclosure 106.

Figure 3:
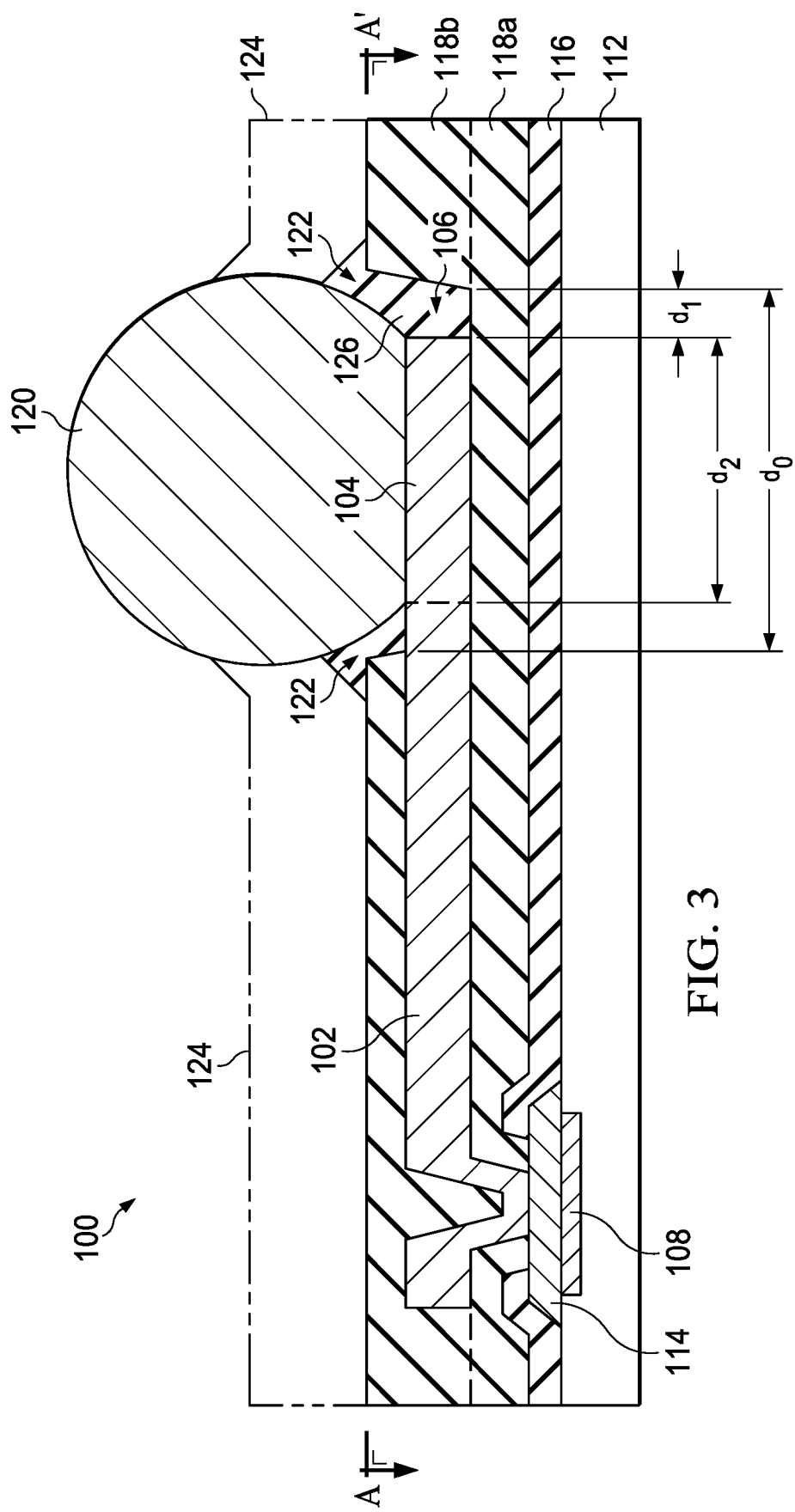
FIG. 3 shows a cross-sectional view of a packaging device in accordance with some embodiments.

FIG. 3 shows a cross-sectional view of a packaging device 100 in accordance with some embodiments. A molding material 124 may not be applied in a widely dispensed method in some embodiments; rather, an epoxy material 126 is applied adjacent the conductive material 120 over a portion of the insulating material 118b proximate the conductive material 120 in a more limited area. The epoxy material 126 comprises an epoxy flux in some embodiments, as an example. The epoxy flux may include epoxy and a flux component. The conductive material 120 is heated to reflow the eutectic material of the conductive material 120, and the flux component facilitates the reflow process, for example. The flux component is cleaned in a subsequent cleaning process, and the epoxy component is left remaining. Alternatively, the epoxy material 126 may comprise other types of materials. The gap 122 between the conductive material 120 and the insulating material 118b and the enclosure 106 between the PPI pad 104 and the insulating material 118b advantageously results in creating the ability to remove flux from the epoxy flux of the epoxy material 126 proximate the conductive material 120 after heating the conductive material 120, in some embodiments, for example.

In other embodiments, both an epoxy material 126 and a molding material 124 may be included. For example, a molding material 124 can be applied after the application of the epoxy material 126, reflow process, and cleaning process, as shown in phantom (e.g., in dashed lines) in FIG. 3.

Figure 4:
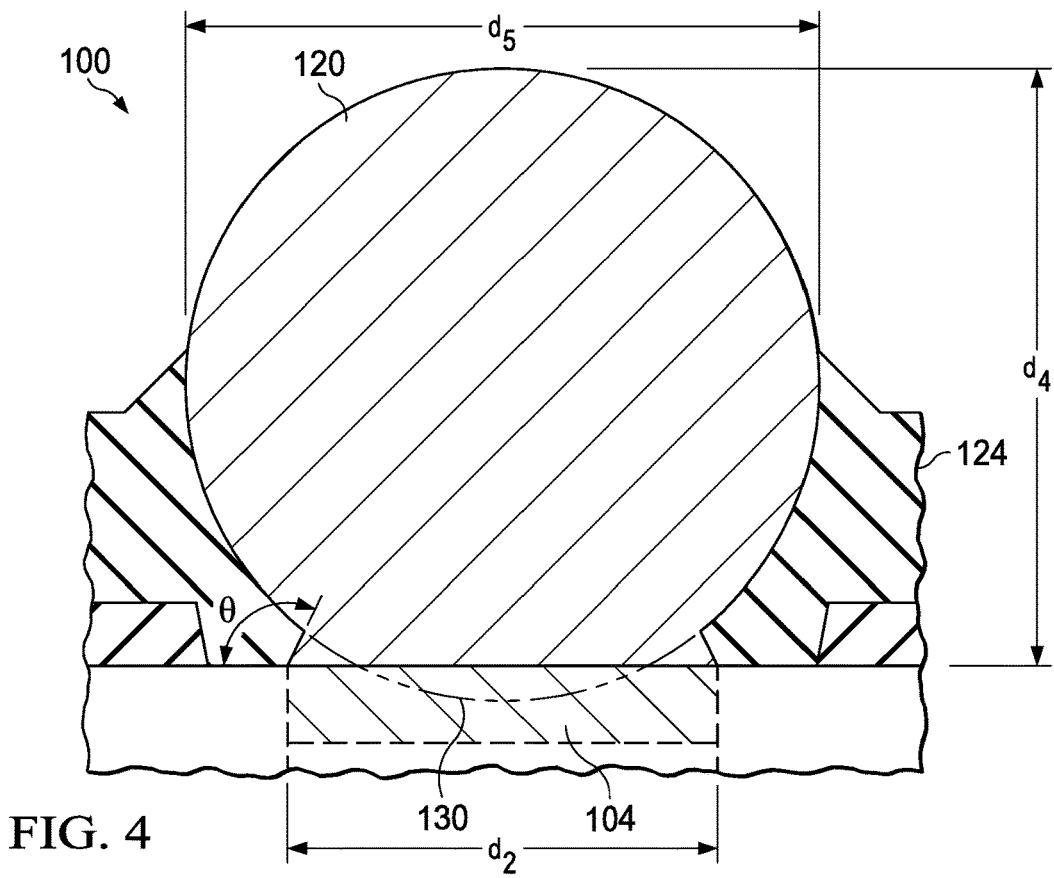
FIGS. 4 and 5 are cross-sectional views of a portion of a packaging device in accordance with some embodiments, illustrating various angles and dimensions of a conductive material attached to the packaging device.
Figure 5:
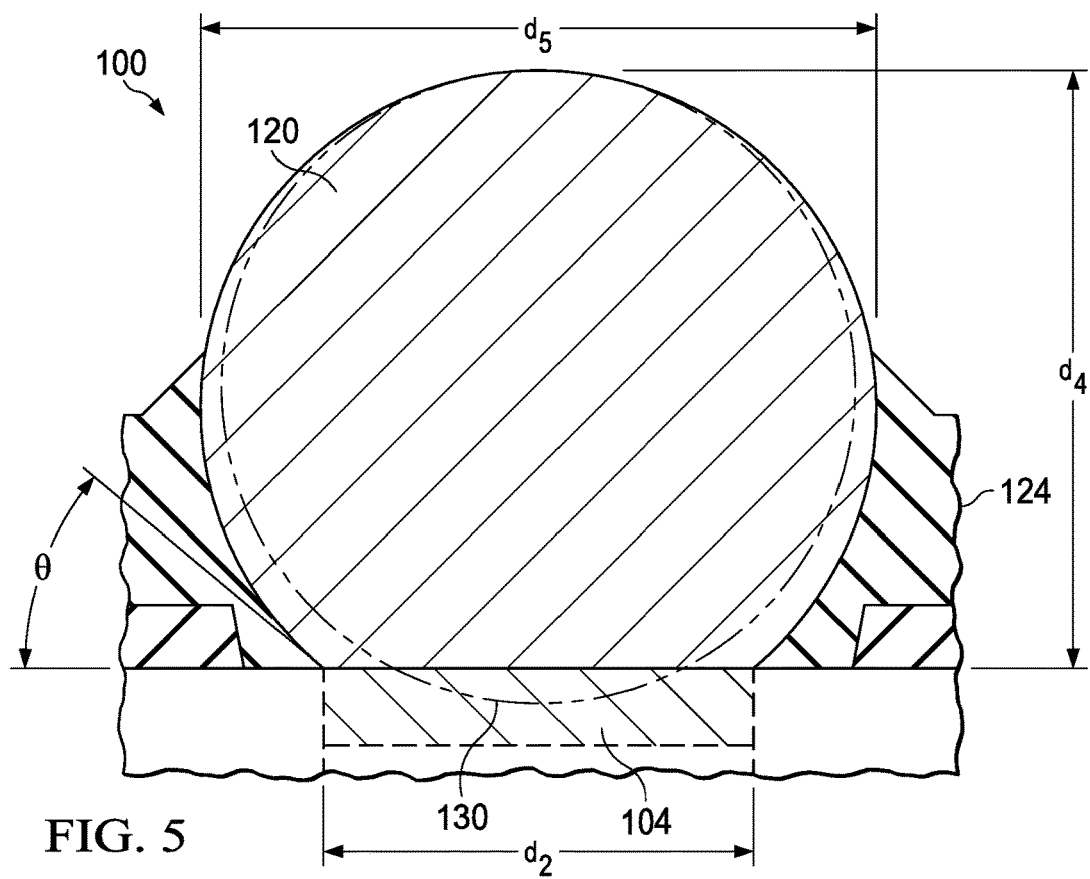

FIGS. 4 and 5 are cross-sectional views of a portion of a packaging device 100 in accordance with some embodiments, illustrating various angles and dimensions of the conductive material 120. A substantially spherical shape 130 is shown for comparison to the conductive material 120 shape. In FIG. 4, a conductive material 120 having an angle Θ that comprises about 90 degrees or greater with respect to a top surface of the substrate 112 (e.g., to the PPI pad 104) is shown. The conductive ball (e.g., the conductive material 120) profile has a substantially obtuse or right angle Θ at the foot, for example. An angle Θ of about 115 degrees is shown in FIG. 4. Dimension d1 (not shown in FIG. 4; see FIG. 1 or FIG. 3) comprises about 5 μm or greater in embodiments wherein angle Θ comprises about 90 degrees or greater, in accordance with some embodiments. In some embodiments illustrated in FIG. 4, (150 degrees>Θ≥90 degrees), for example. Alternatively, angle Θ may comprise other values.

A width or diameter of the PPI pad 104 (and also the conductive material 120 wetting region) comprising dimension d2 comprises about 200 μm in the embodiments shown in FIG. 4, as an example. A height of the conductive material 120 at a tallest region comprising dimension d4 comprises about 240 μm. Dimension d4 comprises about 190 μm to about 250 μm in some embodiments, for example. A width or diameter of the conductive material 120 at a widest region comprising dimension d5 comprises about 250 μm to about 300 μm in some embodiments, for example. In the embodiment shown in FIG. 4, dimension d5 comprises about 250 μm, for example. Alternatively, dimensions d2, d4, and d5 may comprise other values.

In FIG. 5, a conductive material 120 having an angle Θ that comprises less than about 90 degrees with respect to the top surface of the substrate 112 or to the PPI pad 104 is shown. The conductive ball (e.g., conductive material 120) profile has a substantially acute angle Θ at the foot, for example. Dimension d1 (also not shown in FIG. 5; see FIG. 1 or FIG. 3) comprises about 10 μm or greater in embodiments wherein angle Θ comprises less than about 90 degrees, in accordance with some embodiments. In some embodiments illustrated in FIG. 5, (90 degrees>Θ≥30 degrees), for example. Alternatively, angle Θ may comprise other values. Dimension d1 may alternatively comprise other values or other relative values.

In the embodiments shown in FIG. 5, the width or diameter of the PPI pad 104 (and also the conductive material wetting region) comprising dimension d2 comprises about 200 μm, as an example. A height of the conductive material 120 at a tallest region comprising dimension d4 comprises about 200 μm, and dimension d5 comprises about 270 μm, for example. Alternatively, dimensions d2, d4, and d5 may comprise other values.

In the embodiments shown in FIGS. 1 and 3, the packaging devices 100 are formed using a three mask process that includes two insulating material 118a and 118b layers (e.g., two PPO layers), forming a packaging device 100 that comprises PPI structures without underball metallization (UBM) structures; e.g., a packaging device 100 that has non-UBM PPI structures. A lithography mask is used to pattern each of the insulating material 118a and 118b layers, and another lithography mask is used to pattern the conductive material layer that forms the PPI line 102 and PPI pad 104.

Figure 6:
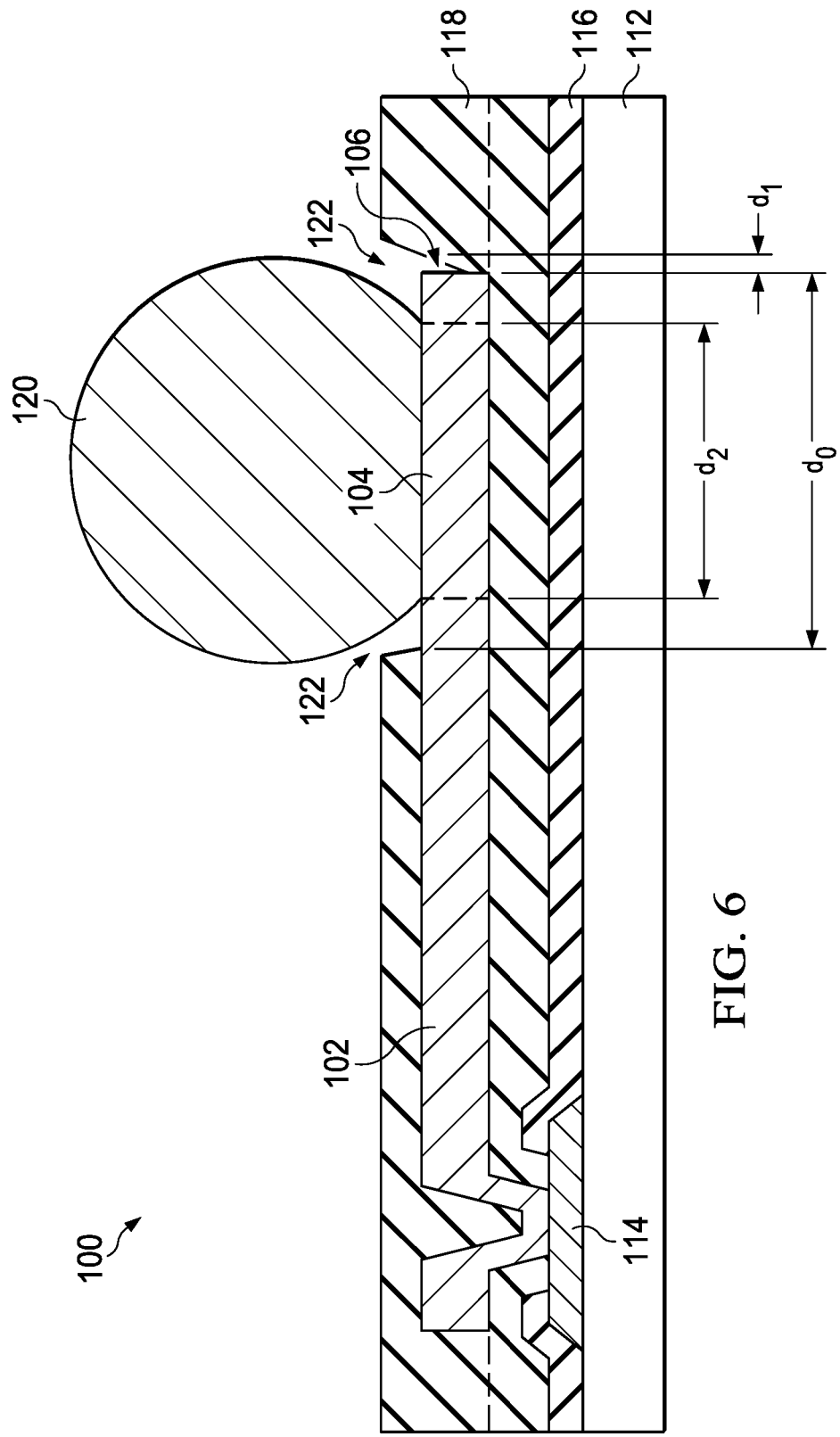
FIG. 6 is a cross-sectional view of a packaging device in accordance with some embodiments.

Embodiments of the present disclosure may also be implemented in packaging devices 100 with non-UBM PPI structures that are formed using a two mask process that includes a single insulating material 118 layer (e.g., one PPO layer), as shown in FIG. 6, which is a cross-sectional view of a packaging device 100 in accordance with some embodiments. Only one insulating material 118 is included in the packaging device 100 in these embodiments. One lithography mask is used to pattern the insulating material 118 and another mask is used to pattern the conductive material layer that forms the PPI line 102 and PPI pad 104. The insulating material 118 may be removed from all edge portions of the PPI pad 104 except in regions where the PPI line 102 is coupled to the PPI pad 104 as illustrated in the other embodiments, or alternatively, the insulating material 118 may be removed from some of the edge portions of the PPI pad 104, as shown in FIG. 6. For example, on the right side of the conductive material 120, the PPI pad 104 extends to the right and contacts the insulating material 118 at a lower region of the PPI pad 104, yet the upper region of the PPI pad 104 has an enclosure 106 and is spaced apart from the insulating material 118 by the predetermined distance comprising dimension d1. Alternatively, the PPI pad 104 may not extend to the right and the contact pad 104 may be spaced apart from the insulating material 118 by a greater predetermined distance comprising dimension d1, as illustrated in FIGS. 1 and 3.

In the embodiment shown in FIG. 6, the PPI pad 104 may comprise an oval shape in a top view (not shown), for example. The enclosure 106 comprising dimension d1 on the right side of the conductive material 120 in FIG. 6 may comprise a crescent shape in a top view, for example. Alternatively, the PPI pad 104 and enclosure 106 may comprise other shapes.

Figure 7:
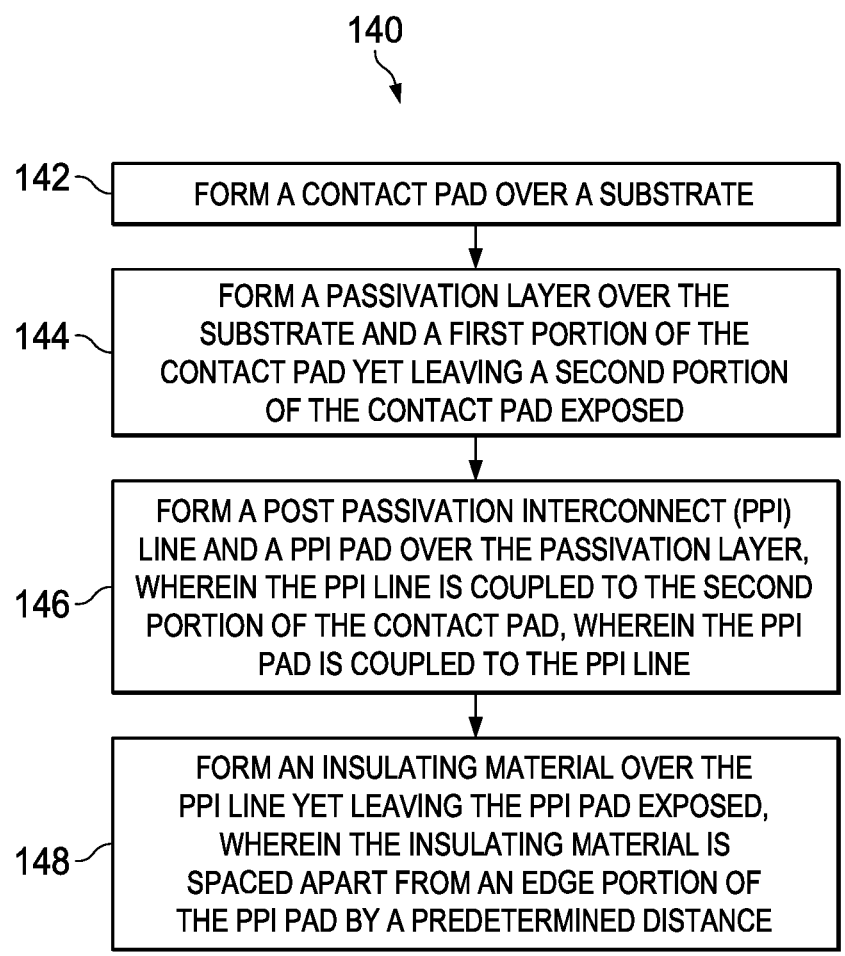
FIG. 7 is a flow chart illustrating a method of manufacturing a packaging device in accordance with some embodiments.

FIG. 7 is a flow chart 140 illustrating a method of manufacturing a packaging device 100 (see also FIG. 6) in accordance with some embodiments of the present disclosure. In step 142, a contact pad 114 is formed over a substrate 112. In step 144, a passivation layer 116 is formed over the substrate 112 and a first portion of the contact pad 114 yet leaving a second portion of the contact pad 114 exposed. In step 146, a PPI line 102 and a PPI pad 104 are formed over the passivation layer 116 coupled to the second portion of the contact pad 114, wherein the PPI pad 104 is coupled to the PPI line 102. In step 148, an insulating material 118 is formed over the PPI line 102 yet leaving the PPI pad 104 exposed. The insulating material 118 is spaced apart from an edge portion of the PPI pad 104 by a predetermined distance comprising dimension d1.

In some embodiments, the method of manufacturing the packaging device 100 further comprises forming a conductive material 120 on the PPI pad 104. Forming the conductive material 120 comprises forming a eutectic material in some embodiments, and the manufacturing method may further comprise forming a flux material on the conductive material 120. The conductive material 120 is then heated to reflow the eutectic material of the conductive material 120. In some embodiments, the packaging device 100 is then cleaned to remove the flux material. Advantageously, the insulating material 118b or 118 being spaced apart from the edge portion of the PPI pad 104 by the predetermined distance comprising dimension d1 results in removing substantially all of the flux material when cleaning the packaging device 100, in some embodiments.

Some embodiments of the present disclosure include methods of manufacturing packaging devices 100, and also include packaging devices 100 manufactured using the methods described herein. The packaging devices 100 include a region for mounting a semiconductor device such as an integrated circuit die, not shown in the drawings. The mounting region may be disposed on an opposite side of the substrate 112 than the PPI line 102, PPI pad 104, and conductive material 120 is formed, for example. Alternatively, a region on the same side of the substrate 112 as the PPI line 102, PPI pad 104, and conductive material 120 may be reserved for mounting a semiconductor device, as another example. After packaging a semiconductor device with the packaging device 100, the packaged semiconductor device can be attached to another packaged semiconductor device, an unpackaged semiconductor device, a printed circuit board (PCB), or in an end application using the conductive material 120 of the packaging device 100, as examples. The packaging devices 100 described herein can alternatively be used using other techniques and in other applications.

Advantages of some embodiments of the disclosure include providing novel packaging devices 100 that prevent flux from remaining between conductive material 120 and upper insulating material 118b and 118 layers. The enlarged distance between the package uppermost insulating materials 118b and 118 and the conductive material 120 facilitates in the cleaning of flux from the gap 122 between the insulating material 118b and 118 and the conductive material 120 and from the enclosure 106 between the insulating material 118b and 118 and the PPI pad 104. The formation of the gap 122 between the insulating material 118b and 118 and conductive material 120 and the formation of the enclosure 106 between the insulating material 118b and 118 and the PPI pad 104 permits the removal of ball mount flux, which prevents the flux from remaining after a cleaning process, which if the flux were to be left remaining, the flux could cause the conductive material 120 to dissolve again or reflow in a subsequent high temperature condition. The removal of the flux also prevents surface leakage with solder ball solution residue.

The novel WLCSP designs improve package reliability and prevent flux induced solder ball dissolution and following surface leakage. The novel PPI designs do not require an under-ball metallization (UBM) structure and thus provide a cost savings. No additional lithography masks or processes are required to implement the enlarged openings in the insulating materials 118b and 118 of the packaging devices 100. The WLCSP designs can be implemented using no additional processes or costs, and require no special design area penalty. Furthermore, the novel packaging device 100 structures and designs are easily implementable in manufacturing and packaging process flows.

In accordance with some embodiments of the present disclosure, a packaging device includes a contact pad disposed over a substrate, and a passivation layer disposed over the substrate and a first portion of the contact pad, wherein a second portion of the contact pad is exposed. A PPI line is disposed over the passivation layer coupled to the second portion of the contact pad, and a PPI pad is disposed over the passivation layer coupled to the PPI line. An insulating material is disposed over the PPI line, wherein the PPI pad is exposed. The insulating material is spaced apart from an edge portion of the PPI pad by a predetermined distance.

In accordance with other embodiments, a packaging device includes a substrate, a contact pad disposed over the substrate, and a passivation layer disposed over the substrate and a first portion of the contact pad, wherein a second portion of the contact pad is exposed. A first insulating material is disposed over the passivation layer, wherein the second portion of the contact pad is exposed. A PPI line is disposed over the first insulating material coupled to the second portion of the contact pad, and a PPI pad is disposed over the passivation layer coupled to the PPI line. A second insulating material is disposed over the PPI line, wherein the PPI pad is exposed. The second insulating material is spaced apart from an edge portion of the PPI pad by a predetermined distance. A conductive material is coupled to the PPI pad.

In accordance with other embodiments, a method of manufacturing a packaging device includes forming a contact pad over a substrate, and forming a passivation layer over the substrate and a first portion of the contact pad yet leaving a second portion of the contact pad exposed. A PPI line and a PPI pad are formed over the passivation layer. The PPI line is coupled to the second portion of the contact pad, and the PPI pad is coupled to the PPI line. The method includes forming an insulating material over the PPI line yet leaving the PPI pad exposed. The insulating material is spaced apart from an edge portion of the PPI pad by a predetermined distance.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a packaging device, the method comprising:
    forming a contact pad over a substrate;
    forming a passivation layer over the substrate and a first portion of the contact pad yet leaving a second portion of the contact pad exposed;
    depositing a first insulating layer over the passivation layer and the contact pad;
    forming a post passivation interconnect (PPI) line and a PPI pad over the first insulating layer and the passivation layer, the PPI line being coupled to the second portion of the contact pad, the PPI pad being coupled to the PPI line, a top surface of the PPI line being level with a top surface of the PPI pad;
    depositing a second insulating material over the PPI line, the PPI pad, and the passivation layer; and
    patterning the second insulating material to expose the top surface and a second sidewall of the PPI pad, wherein after the patterning, the second insulating material has a first sidewall spaced apart from the second sidewall of the PPI pad by a predetermined distance, the first sidewall of the second insulating material extending below the top surface of the PPI pad; and
    forming a conductive material physically contacting the exposed top surface of the PPI pad, wherein after forming the conductive material, a portion of the exposed top surface of the PPI pad is exposed between the conductive material and the second insulating material.

2. The method of claim 1 further comprising:
    depositing a third insulating material over the second insulating material and surrounding at least a lower portion of the conductive material, the third insulating material being interposed between the first sidewall of the second insulating material and the second sidewall of the PPI pad.

3. The method of claim 1 further comprising:
    depositing a third insulating material over the second insulating material and surrounding at least a lower portion of the conductive material, the third insulating material contacting the top surface of the PPI pad.

4. The method of claim 1, wherein forming the conductive material comprises forming a eutectic material.

5. The method of claim 4 further comprising:
    forming a flux material on the conductive material; and
    heating the conductive material to reflow the eutectic material of the conductive material.

6. The method of claim 5 further comprising:
    after heating the conductive material, cleaning the packaging device to remove the flux material.

7. The method of claim 5, wherein the flux material comprises an epoxy flux material, wherein after the heating the conductive material, epoxy material is interposed between the first sidewall of the second insulating material and the second sidewall of the PPI pad.

8. The method of claim 1, wherein the predetermined distance comprises about 5 µm or greater.

9. The method of claim 1, wherein the predetermined distance comprises about 10 µm or greater.

10. A method comprising:
    forming a passivation layer over a substrate;
    forming a first insulating layer over the passivation layer;
    forming a post passivation interconnect (PPI) over the first insulating layer, the PPI having a top surface;
    depositing a second insulating layer on the PPI and the first insulating layer, the second insulating layer contacting the top surface of the PPI;
    patterning the second insulating layer to expose a first portion of the top surface of the PPI and a first portion of the first insulating layer, wherein after the patterning, the second insulating material has a first sidewall spaced apart from a second sidewall of the PPI by a predetermined distance;
    disposing a conductive bump on the exposed first portion of the top surface of the PPI, the conductive bump contacting the exposed first portion of the top surface of the PPI; and
    heating the conductive bump to reflow the conductive bump, wherein after heating the conductive bump, a portion of the first portion of the top surface of the PPI is exposed between the conductive bump and the second insulating layer.

11. The method of claim 10 further comprising:
    forming a contact pad over the substrate, the passivation layer and the first insulating layer being over the contact pad, the PPI extending through the first insulating layer and the passivation layer to be electrically coupled to the contact pad.

12. The method of claim 10, wherein after patterning the second insulating layer, the second insulating layer has a first sidewall spaced apart from a second sidewall of the PPI by a predetermined distance.

13. The method of claim 12, wherein the predetermined distance comprises about 5 µm or greater.

14. The method of claim 12 further comprising:
    forming a third insulating layer over the second insulating layer, the third insulating layer being interposed between the first sidewall of the second insulating layer and the second sidewall of the PPI.

15. The method of claim 10 further comprising:
    forming a third insulating layer over the second insulating layer and contacting the exposed first portion of the top surface of the PPI.

16. A method comprising:
    forming a contact pad over a substrate;
    forming a passivation layer over the contact pad with at least a portion of the contact pad exposed through the passivation layer;
    forming a first insulating material over the passivation layer and the contact pad;
    forming a post passivation interconnect (PPI) structure over and extending through the first insulating material and the passivation layer to be coupled to the contact pad, the PPI structure comprising a PPI line and a PPI pad;

forming a second insulating material over the PPI line, the PPI pad, the first insulating material, and the passivation layer;

patterning the second insulating material to expose the PPI pad, a first portion of the PPI line, and a first portion of the first insulating material, wherein after the patterning, the second insulating material has a first sidewall spaced apart from a second sidewall of the PPI pad by a predetermined distance; and forming a conductive bump on the exposed PPI pad, a top surface of the first portion of the PPI line exposed between the conductive bump and the second insulating material.

17. The method of claim 16, wherein the first sidewall of the second insulating material extends below a top surface of the PPI pad.

18. The method of claim 16, wherein a lower portion of the first sidewall of the second insulating material contacts a lower portion of the second sidewall of the PPI pad.

19. The method of claim 16 further comprising:
disposing a flux material; and
performing a cleaning process on the conductive bump and the second insulating material to remove flux material.

* * * * *